United States Patent
Lin et al.

(10) Patent No.: US 10,002,848 B1
(45) Date of Patent: Jun. 19, 2018

(54) TEST METHOD FOR A REDISTRIBUTION LAYER

(71) Applicant: Powertech Technology Inc., Hsinchu County (TW)

(72) Inventors: Han-Wen Lin, Hsinchu County (TW); Hung-Hsin Hsu, Hsinchu County (TW); Shang-Yu Chang-Chien, Hsinchu County (TW); Nan-Chun Lin, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 0 days. days.

(21) Appl. No.: 15/619,988

(22) Filed: Jun. 12, 2017

(51) Int. Cl.
  *H01L 21/48* (2006.01)
  *H01L 25/065* (2006.01)
  *H01L 21/027* (2006.01)
  *H01L 23/485* (2006.01)
  *G03F 7/004* (2006.01)

(52) U.S. Cl.
  CPC ........ *H01L 25/0652* (2013.01); *G03F 7/0041* (2013.01); *H01L 21/0273* (2013.01); *H01L 23/485* (2013.01)

(58) Field of Classification Search
  CPC ... H05K 13/08; H05K 1/0266; H01L 21/4853
  See application file for complete search history.

(56) References Cited

U.S. PATENT DOCUMENTS

| | | | |
|---|---|---|---|
| 2015/0179616 A1* | 6/2015 | Lin | H01L 25/50 257/773 |
| 2016/0266197 A1 | 9/2016 | Roehner et al. | |

FOREIGN PATENT DOCUMENTS

TW 201307860 A 2/2013

* cited by examiner

*Primary Examiner* — Thomas L Dickey
(74) *Attorney, Agent, or Firm* — Birch, Stewart, Kolasch & Birch, LLP (57) ABSTRACT

A conductive layer is formed on the first zone of a carrier. The redistribution layer is formed on the conductive layer on the first zone and the second zone of the carrier. Then an open-test and a short-test are performed to the redistribution layer. Since the conductive layer and the parts of the redistribution layer formed on the conductive layer constitute a closed loop, a load is presented if the redistribution layer is formed correctly. In addition, no load is presented if the redistribution layer is formed correctly since the parts of the redistribution layer formed on the second zone of the carrier constitute an open loop. Therefore, whether the redistribution layer is flawed or not is determined before the dies are boned on the redistribution layer. Thus, no waste of the good die is occurred because of the flawed redistribution layer.

22 Claims, 9 Drawing Sheets

TEST METHOD FOR A REDISTRIBUTION LAYER

BACKGROUND OF THE INVENTION

1. Field of the Invention

The present invention relates to a test method during manufacturing processes of the semiconductor devices, and more particularly to a test method for a redistribution layer.

2. Description of the Prior Arts

Due to the fact that portable electronic devices are widely used, more and more features are demanded to be built in the portable electronic devices. The market requires the electronic devices to be not only powerful but also thin and small. To achieve that goal, a new method is proposed to directly apply redistribution layers on surface of the combination of the silicon die and the organic compound. A redistribution layer (RDL) is a layer composed with metal traces and vias that provide the path to transmit power or signal form the pins of the dies to outer surface of the package. Normally. the IC devices require high I/O pads to deliver high performance. However, for the fixed die size, the area of the die might not be sufficient to offer spaces for large quantity of I/O pads. This problem may be solved by using the redistribution layer. At the same time, the performance is expected to be better and power consumption is lower due to shorten traces.

There are several methods to perform such technique. One of them is so-called "chip-last". Chip-last package is made by the sequence that the redistribution layers are formed on the carrier first and then the dies are bonded on the redistribution layers. In chip-last process flow, the electrical performance of the redistribution layers cannot be determined before the dies are bonded because of the incompletion of the electrical loop. In this case, if the good dies are boned on the flawed redistribution layers, the good dies are wasted, which causes yield loss and increases the cost of production.

Since the flawed redistribution layers can only be determined after the dies are boned on the redistribution layers, it is risky to bond good dies on the RDL without knowing its quality. To overcome the shortcomings, the present invention provides a test method for a redistribution layer to mitigate or to obviate the aforementioned problems.

SUMMARY OF THE INVENTION

The main objective of the present invention is to provide a test method for a redistribution layer before the dies are bonded to the redistribution layer.

According to the present invention, a conductive layer is formed on a first zone of a carrier. The redistribution layer is formed on the conductive layer and a second zone of the carrier. Then an open-test and a short-test are performed to the redistribution layer. Since the conductive layer and the parts of the redistribution layer formed on the conductive layer constitute a closed loop, a load should be presented if the redistribution layer is well developed. In addition, a load should not be presented if the redistribution layer is formed correctly on the second zone since the parts of the redistribution layer formed on the second zone of the carrier constitutes an open loop. In this way, whether the redistribution layer is defective can be determined before the dies are boned on the redistribution layer. No waste of the good die occurs because of the flawed redistribution layer.

Other objectives, advantages and novel features of the invention will become more apparent from the following detailed description when taken in conjunction with the accompanying drawings.

DETAILED DESCRIPTION OF THE EMBODIMENTS

With reference to the attached drawings, the present invention is described by means of the embodiments below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detailed component layouts may be more complicated.

Figure 1:
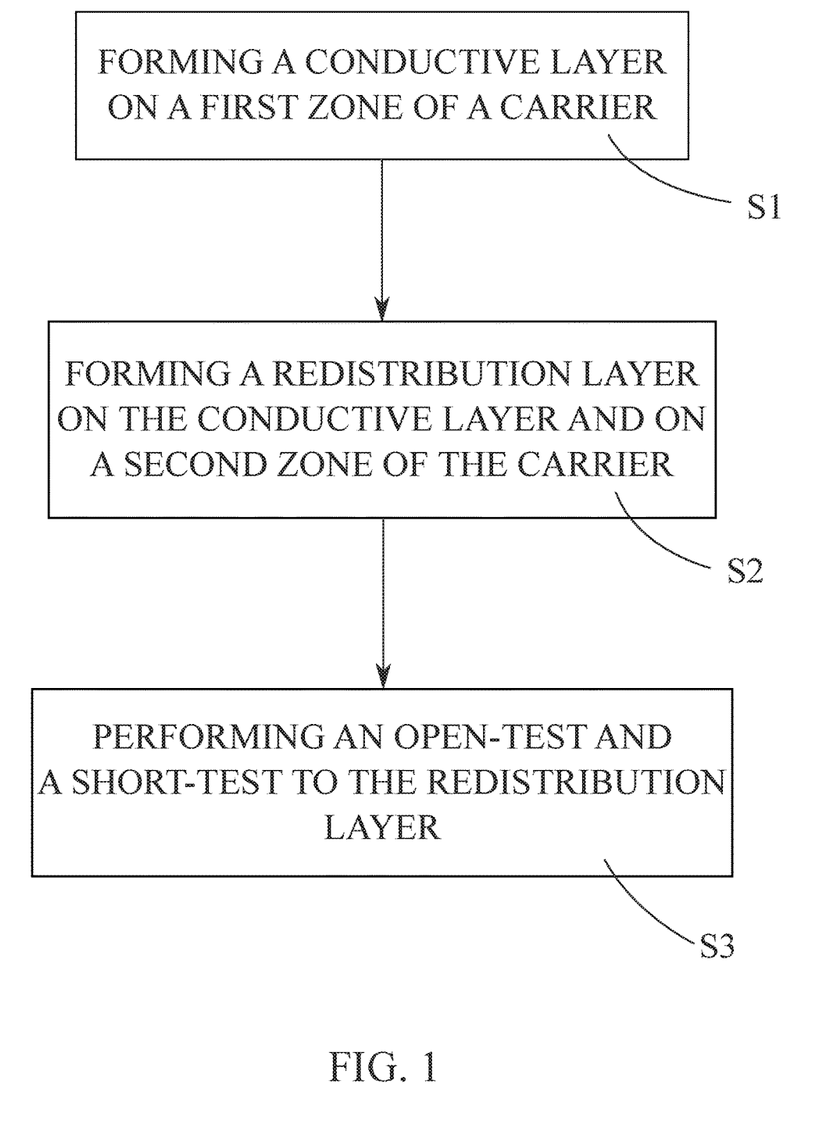
FIG. 1 is a flow chart of a first embodiment of a test method for a redistribution layer in accordance with the present invention.

With reference to FIG. 1, a test method for a redistribution layer in accordance with the present invention comprises steps of forming a conductive layer on a first zone of a carrier (S1), forming a redistribution layer on the conductive layer and on a second zone of the carrier (S2), and performing an open-test and a short-test to the redistribution layer (S3).

Figure 2A:
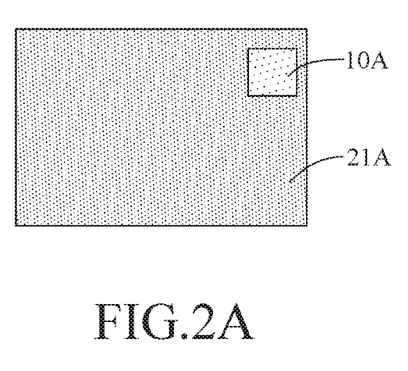
FIGS. 2A to 2E are illustrative views to show different patterns of the conductive layer formed by the test method in FIG. 1.
Figure 2B:
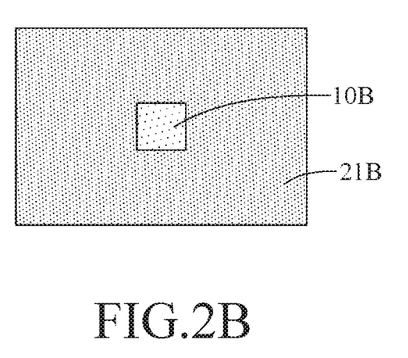
Figure 2C:
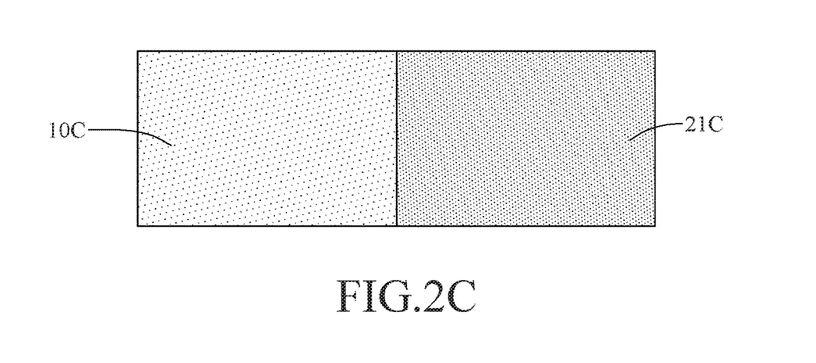
Figure 2D:
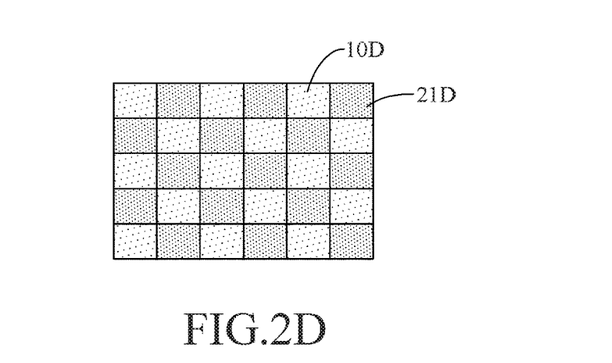
Figure 2E:
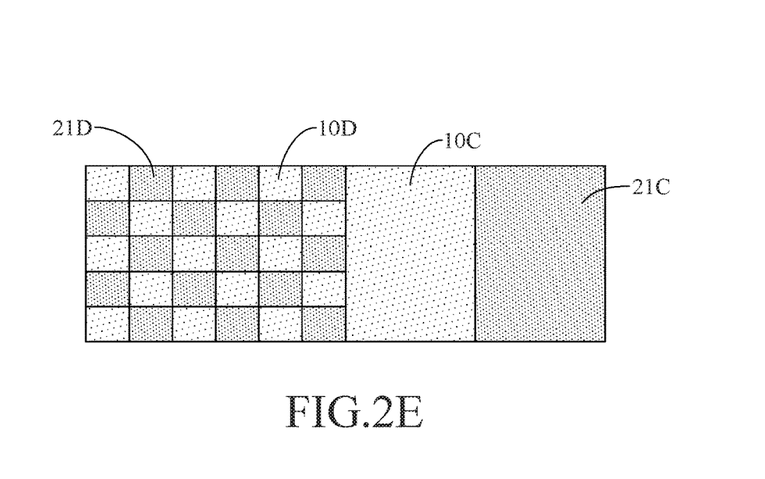
Figure 3:
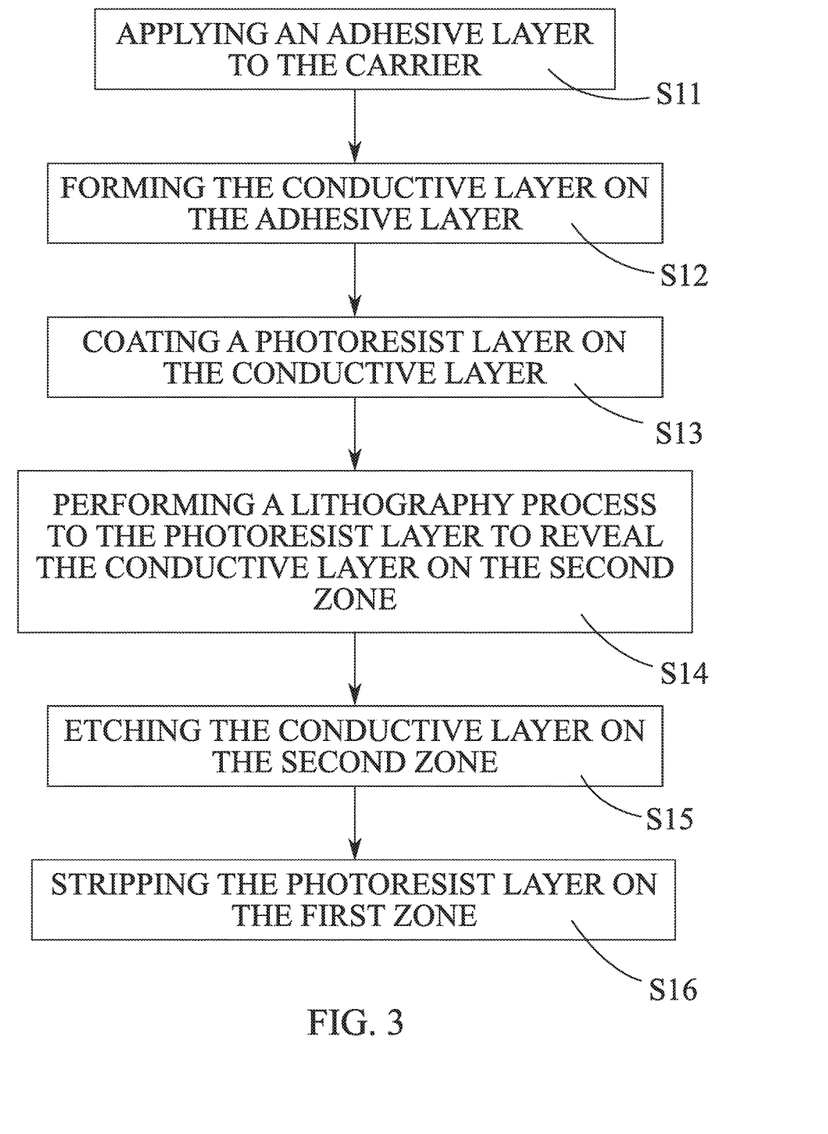
FIG. 3 is a flow chart of forming the conductive layer of the test method in FIG. 1.

With reference to FIG. 1, the conductive layer is formed on the first zone of the first surface of the carrier (S1) and is arranged in a predetermined pattern. The conductive layer may be arranged in different patterns and may overlap different areas with the first surface of the carrier. In one embodiment as shown in FIG. 2A, the conductive layer 10A is formed randomly on the first surface of the carrier and overlaps a smaller area than the second zone 21A of the first surface of the carrier. In one embodiment as shown in FIG. 2B, the conductive layer 10B is formed at the center of the first surface of the carrier and overlaps a smaller area than the second zone 21B of the first surface of the carrier. In one embodiment as shown in FIG. 2C, the conductive layer 10C is arranged continuously, which has the same dimension with the second zone 21C of the first surface of the carrier and overlaps half of the first surface of the carrier. In one embodiment as shown in FIG. 2D, the conductive layer 10D is formed in multiple sections, which has the same dimension with the second zone 21D of the first surface of the carrier and overlaps half of the first surface of the carrier. The sections of the conductive layer 10D are arranged separately and are staggered with the second zone 21D of the first surface of the carrier. In one embodiment as shown in FIG. 2E, the conductive layer 10C, 10D are arranged in different patterns to cover different zones of the first surface of the carrier. The first zone and the second zone of the carrier may be altered in the aforementioned embodiments. The first zone may have a larger area than the second zone.

With reference to FIGS. 1, 3 and 4A to 4E, the step of forming the conductive layer 10 on the first zone 22 of the first surface 201 of the carrier 20 (S1) may comprise but is not limited to following steps:

Applying an adhesive layer 30 to the carrier 20 (S11) (shown in FIG. 4A): An adhesive layer 30 is applied to the first surface 201 of the carrier 20.

Forming the conductive layer 10 on the adhesive layer 30 (S12) (shown in FIG. 4B): The conductive layer 10 is foil led on the adhesive layer 30. In one embodiment, the conductive layer 10 is deposited on the adhesive layer 30. In one embodiment, the conductive layer 10 is made of metal, such as titanium (Ti), titanium-tungsten (TiW), titanium-copper (TiCu), or other metal that can be used as adhesive or seed layer.

Coating a photoresist layer 40 on the conductive layer 10 (S13) (shown in FIG. 4C): A photoresist layer 40 is coated on the conductive layer 10.

Performing a lithography process to the photoresist layer 40 to reveal the conductive layer 10 on the second zone 21 (S14) (shown in FIG. 4D): The photoresist layer 40 is exposed through a photomask to a source of activating radiation to remove the photoresist layer 40 on the second zone 21 of the first surface 201 of the carrier 20.

Etching the conductive layer 10 on the second zone 21 (S15) (shown in FIG. 4E): The conductive layer 10 on the second zone 21 of the first surface 201 of the carrier 20 is etched to leave the conductive layer 10 on the first zone 22 of the first surface 201 of the carrier 20.

Figure 4A:
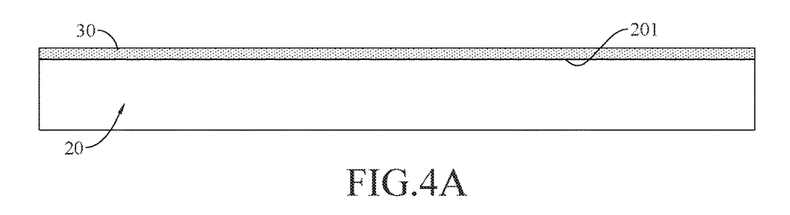
FIGS. 4A to 4F, 5 and 6 are cross-sectional views of a structure during performing the process in FIG. 1.
Figure 4B:
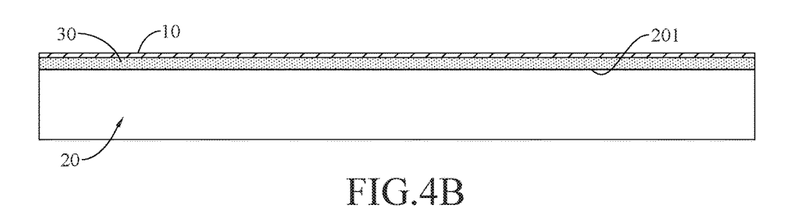
Figure 4C:
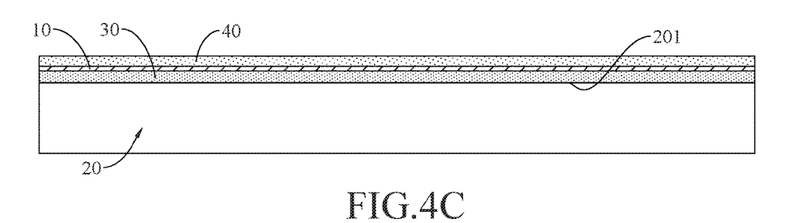
Figure 4D:
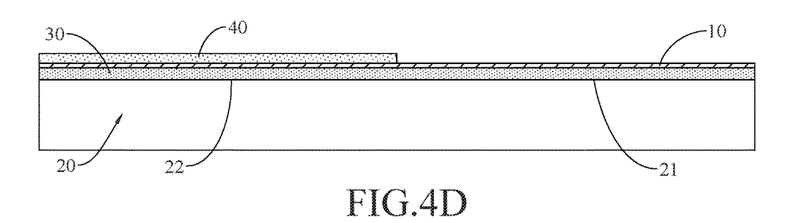
Figure 4E:
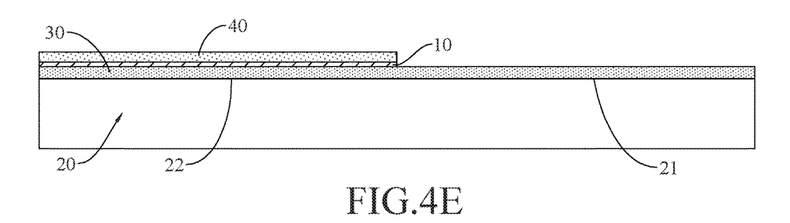
Figure 4F:
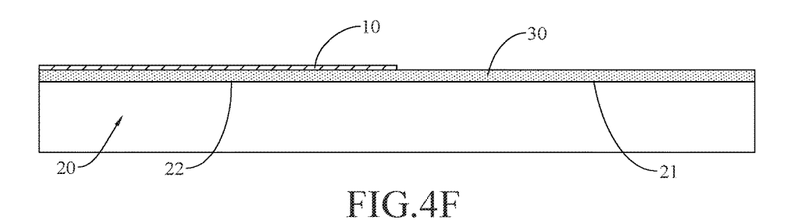

Stripping the photoresist layer 40 on the first zone 22 (S16) (shown in FIG. 4F): The photoresist layer 40 remaining on the first zone 22 of the first surface 201 of the carrier 20 is stripped to expose the conductive layer 10 on the first zone 22.

Figure 5:
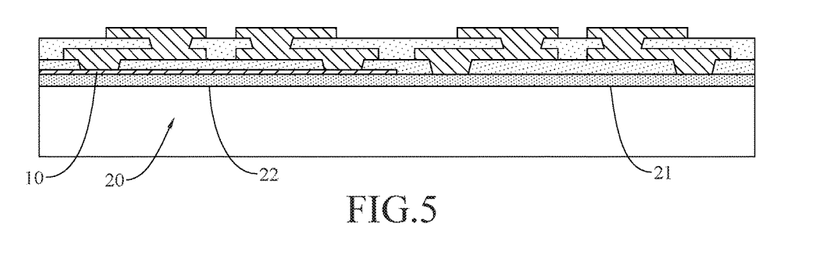

With reference to FIGS. 1 and 5, after the conductive layer 10 is formed on the carrier 20, the redistribution layer 50 is formed on the first zone 22 and on the second zone 21 of the first surface 201 of the carrier 20 (S2). The redistribution layer 50 may be formed by sputtering, patterned etching, patterned electrical plating, or lift-off process.

Figure 6:
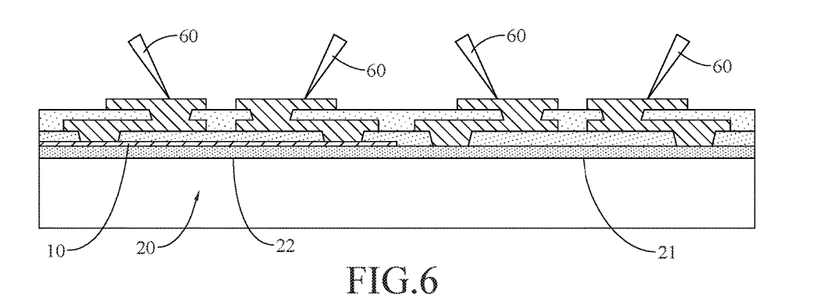

With reference to FIGS. 1 and 6, after the redistribution layer 50 is formed on the conductive layer 10 on the first zone 22 and on the second zone 21 of the first surface 201 of the carrier 20, an open-test and a short-test are performed to the redistribution layer 50 (S3). The redistribution layer 50 is connected electrically to a test tool 60 to perform the open-test on parts of the redistribution layer 50 formed on the first zone 22 and perform the short-test on parts of the redistribution layer 50 formed on the second zone 21.

Since the test tool 60 and the parts of the redistribution layer 50 formed on the conductive layer 10 on the first zone 22 constitute a closed loop, a load is presented during the open-test if the redistribution layer 50 is formed correctly.

Since the test tool 60 and the parts of the redistribution layer 50 formed on the second zone 21 constitute an open loop, no load is presented during the short-test if the redistribution layer 50 is formed correctly. Therefore, after the open-test and short-test are performed on the redistribution layer 50, the redistribution layer 50 is determined to be formed correctly or with defect. Furthermore, because the conductive layer 10 may be arranged in different patterns and may overlap different areas with the first surface 201 of the carrier 20, the open-test and the short-test are performed on different parts of the redistribution layer 50 to randomly test the quality of the redistribution layer 50.

In one embodiment, the open-test and the short-test are performed simultaneously. In another embodiment, the open-test and the short-test are performed non-simultaneously.

Figure 7:
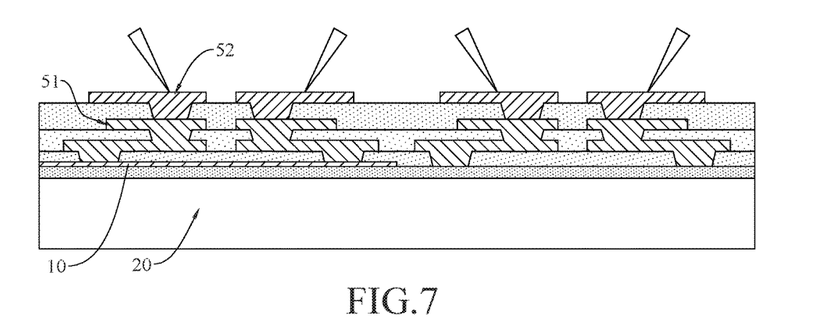
FIG. 7 is a cross-sectional view of a structure during testing subsequent redistribution layer in accordance with the present invention.

With further reference to FIG. 7, the redistribution layer 50 may comprise multiple sub-layers 51 and 52. The open-test and short-test may be performed after each sub-layer 51 or 52 of the redistribution layer 50 is formed. Thus, the quality of each sub-layer 51 or 52 of the redistribution layer 50 is determined when each sub-layer 51 or 52 of the redistribution layer 50 is formed.

Figure 8:
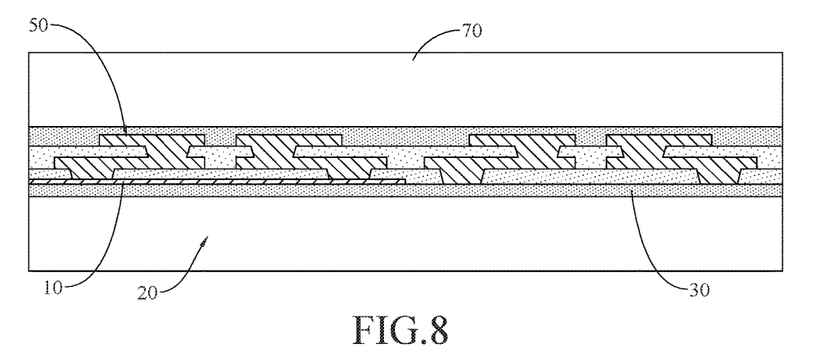
FIGS. 8 and 9 are a cross-sectional view of a structure during a transfer bonding process in accordance with the present invention.
Figure 9:
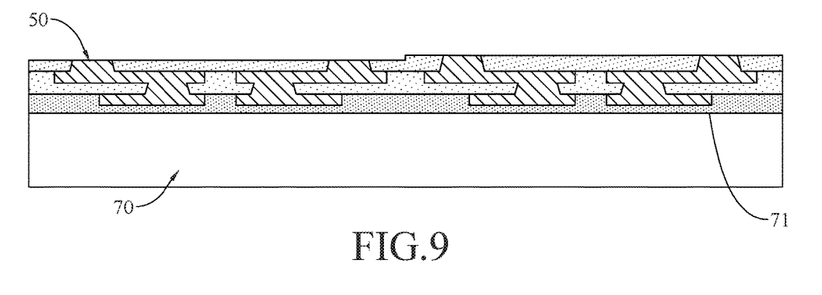

With reference to FIGS. 8 and 9, after the open-test and short-test are performed, the conductive layer 10 may be removed since the conductive layer 10 is only used to constitute a closed loop with the redistribution layer 50 during the open-test and is not part of the semiconductor package. A transfer bonding process is performed to bond the redistribution layer 50 on a secondary carrier 70 and to remove the conductive layer 10. The secondary carrier 70 with a secondary adhesive layer 71 are applied to a first surface of the redistribution layer 50 opposite to a second surface of the redistribution layer 50 bonding to the conductive layer 10 and the carrier 20. Then the carrier 20 and the conductive layer 10 are removed to reveal the second surface of the redistribution layer 50. Thus, the second surface of the redistribution layer 50 can be bond to the die in the coming processes. In one embodiment, the conductive layer 10 may separately be removed through an etching, a polishing, or a grinding process after the carrier 20 has been detached. In another embodiment, the carrier 20 and the conductive layer 10 are removed together through a grinding process. The grinding process may also be used to ensure a planar surface when the carrier 20 and the conductive layer 10 are removed.

Since the conductive layer 10 is formed on the first zone 22 of the first surface 201 of the carrier 20 and the conductive layer 10 is not formed on the second zone 21 of the first surface 201 of the carrier 20, the parts of the second surface of the redistribution layer 50 aligning with the first zone 22 is lower than the parts of the second surface of the redistribution layer 50 aligning with the second zone 21. However, the height difference of the redistribution layer 50 does not affect the coming process since the thickness of the conductive layer 10 may not be significant enough to affect the following processes.

Figure 10:
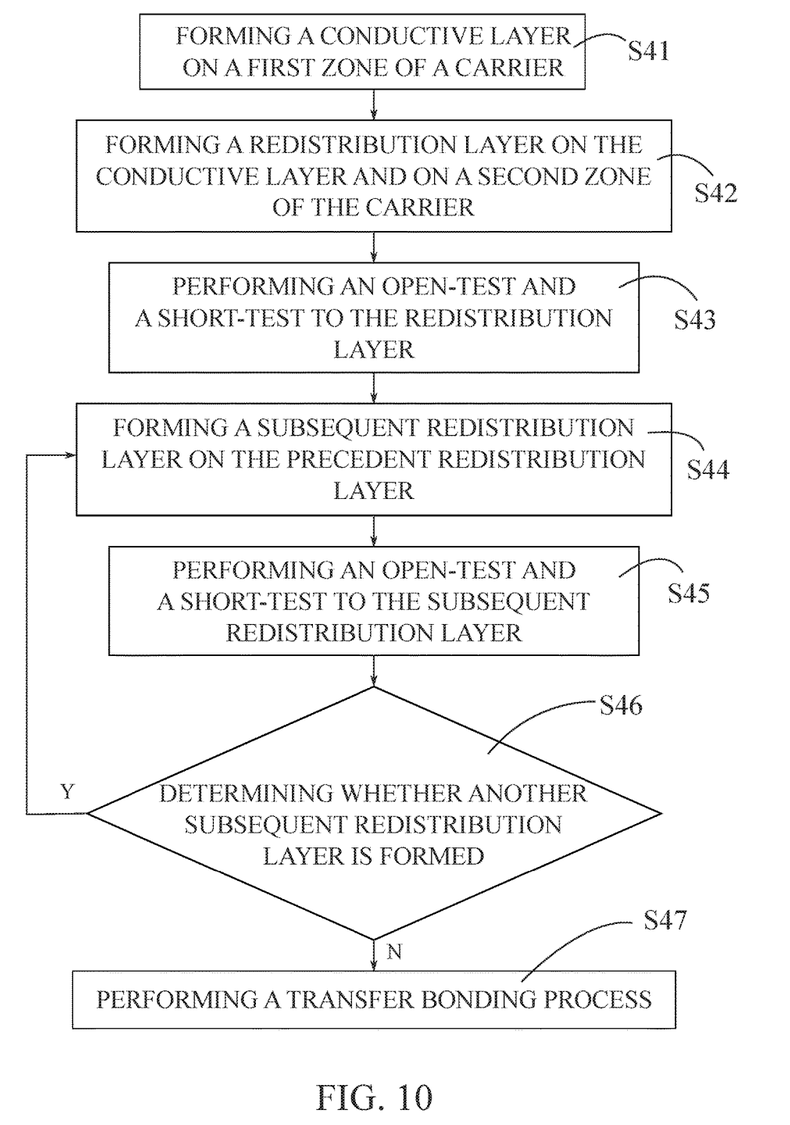
FIG. 10 is a flow chart of a second embodiment of a test method for a redistribution layer in accordance with the present invention.

In one embodiment as shown in FIG. 10, a test method for a redistribution layer in accordance with the present invention comprises steps of forming a conductive layer on the first zone of a carrier (S41), forming a redistribution layer on the conductive layer on the first zone and on the second zone of the carrier (S42), performing an open-test and a short-test to the redistribution layer (S43), forming a subsequent redistribution layer on the precedent redistribution layer (S44), performing an open-test and a short-test to the subsequent redistribution layer (S45), determining whether another subsequent redistribution layer is formed (S46), and performing a transfer bonding to remove the first carrier and the conductive layer when no other subsequent redistribution layer is formed (S47). When another subsequent redistribution layer is determined to be formed, it returns to perform the step S44. Therefore, when multiple redistribution layers are formed, the open-test and the short-test are performed to each redistribution layer to determine the quality of each redistribution layer.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A test method for a redistribution layer comprising steps of:
    forming a conductive layer on a first zone of a first surface of a carrier;
    forming a redistribution layer on the conductive layer on the first zone and on a second zone of the first surface of the carrier;
    performing an open-test and a short-test to the redistribution layer; and
    removing the carrier and the conductive layer.

2. The test method as claimed in claim 1, wherein the open-test and the short-test are performed simultaneously.

3. The test method as claimed in claim 1, wherein the open-test and the short-test are performed non-simultaneously.

4. The test method as claimed in claim 1, wherein in the step of forming the conductive layer, the conductive layer is arranged as a predetermined pattern.

5. The test method as claimed in claim 1, wherein in the step of forming the conductive layer, the first zone of the carrier comprises of random portions of the first surface of the carrier.

6. The test method as claimed in claim 5, wherein in the step of forming the conductive layer, the first zone of the carrier has an area less than an area of the second zone of the carrier.

7. The test method as claimed in claim 5, wherein in the step of forming the conductive layer, the first zone of the carrier has an area more than an area of the second zone of the carrier.

8. The test method as claimed in claim 1, wherein in the step of forming the conductive layer, the first zone of the carrier comprises the center of the first surface of the carrier.

9. The test method as claimed in claim 1, wherein in the step of forming the conductive layer, the first zone of the carrier is arranged continuously and has the same dimension with the second zone of the first surface of the carrier.

10. The test method as claimed in claim 9, wherein in the step of forming the conductive layer, the first zone of the carrier comprises a half of a total area of the first surface of the carrier.

11. The test method as claimed in claim 1, wherein in the step of forming the conductive layer, the first zone of the carrier comprises multiple sections of the first surface of the carrier arranged separately and are staggered with the second zone of the first surface of the carrier, the first zone of the carrier having the same dimension with the second zone of the first surface of the carrier.

12. The test method as claimed in claim 11, wherein in the step of forming the conductive layer, the first zone of the carrier comprises a half of a total area of the first surface of the carrier.

13. The test method as claimed in claim 1, wherein in the step of forming the conductive layer, the first zone of the carrier has an area less than an area of the second zone of the carrier.

14. The test method as claimed in claim 1, wherein in the step of forming the conductive layer, the first zone of the carrier has an area more than an area of the second zone of the carrier.

15. The test method as claimed in claim 1, wherein in the step of forming the conductive layer, the first zone of the carrier comprises a half of a total area of the first surface of the carrier.

16. The test method as claimed in claim 1, wherein the step of forming the conductive layer comprises steps of:
    applying an adhesive layer to the first surface of the carrier;
    forming the conductive layer on the adhesive layer;
    coating a photoresist layer on the conductive layer;
    performing a lithography process to the photoresist layer to remove the photoresist layer on the second zone of the first surface of the carrier;
    etching the conductive layer on the second zone of the first surface of the carrier; and
    stripping the photoresist layer on the first zone of the first surface of the carrier.

17. The test method as claimed in claim 1, wherein the conductive layer is made of Ti, TiW, or TiCu.

18. The test method as claimed in claim 1, before removing the carrier and the conductive layer, further comprising a step of:
    applying a secondary carrier and a secondary adhesive layer to a first surface of the redistribution layer opposite to a second surface of the redistribution layer bonding to the conductive layer and the carrier.

19. The test method as claimed in claim 1, wherein the redistribution layer comprises of multiple sub-layers and the open-test and the short-test are performed after each sub-layers of the redistribution layer is formed.

20. A test method for a redistribution layer comprising steps of:
    forming a conductive layer on a first zone of a first surface of a carrier;
    forming a redistribution layer on the first zone and on the second zone of the first surface of the carrier;
    performing an open-test and a short-test to the redistribution layer;
    forming a subsequent redistribution layer on the precedent redistribution layer;
    performing an open-test and a short-test to the subsequent redistribution layer;
    determining whether another subsequent redistribution layer is formed; if another subsequent redistribution layer is determined to be formed, returning to the step of forming a subsequent redistribution layer on the precedent redistribution layer; and if no subsequent redistribution layer is determined to be formed, removing the carrier and the conductive layer.

21. The test method as claimed in claim 20, wherein in the step of performing an open-test and a short-test to the subsequent redistribution layer, the open-test and the short-test are performed simultaneously.

22. The test method as claimed in claim 20, wherein in the step of performing an open-test and a short-test to the subsequent redistribution layer, the open-test and the short-test are performed non-simultaneously.

* * * * *